US006781483B2

(12) United States Patent
Tanaka et al.

(10) Patent No.: US 6,781,483 B2
(45) Date of Patent: Aug. 24, 2004

(54) SURFACE ACOUSTIC WAVE FILTER (75) Inventors: Naoki Tanaka, Sakai (JP); Tatsuro Usuki, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/022,096

(22) Filed: Dec. 13, 2001

(65) Prior Publication Data

US 2002/0075102 A1 Jun. 20, 2002

(30) Foreign Application Priority Data

Dec. 15, 2000 (JP) ....................................... 2000-382849

(51) Int. Cl.[7] .............................................. H03H 9/64
(52) U.S. Cl. .................... 333/193; 333/195; 310/313 B
(58) Field of Search ................. 333/193–196; 310/313 R, 313 B, 313 C, 313 D (56) References Cited

U.S. PATENT DOCUMENTS

| 5,521,453 | A | * | 5/1996 | Yatsuda ................... 310/313 R |
| 5,694,096 | A | * | 12/1997 | Ushiroku et al. ........... 333/195 |
| 5,717,367 | A | * | 2/1998 | Murai ......................... 333/195 |
| 5,864,262 | A | * | 1/1999 | Ikada .......................... 333/193 |
| 6,462,632 | B1 | * | 10/2002 | Fujii et al. .................. 333/193 |
| 6,501,208 | B1 | * | 12/2002 | Kuroda .................... 310/313 R |

FOREIGN PATENT DOCUMENTS

| CN | 1105166 A | 7/1995 |
| JP | 6-260876 | 9/1994 |
| JP | 7-30367 | 1/1995 |
| JP | 7-86870 | 3/1995 |
| JP | 7-212183 | 8/1995 |
| JP | 7-307641 | 11/1995 |
| JP | 8-191229 | 7/1996 |
| JP | 9-8599 | 1/1997 |
| JP | 9-98065 | 4/1997 |
| JP | 9-162695 | 6/1997 |
| JP | 9-186553 | 7/1997 |
| JP | 9-252232 | 9/1997 |
| JP | 10-65481 | 3/1998 |
| JP | 2000-315931 | * 11/2000 |

OTHER PUBLICATIONS

"A SAW Filter Using A Two–Port Resonator With One–Port Resonators Connected In Series At Input and Output Ports"—Tsutomu Nagatsuka et al., Proceeding of the 1994 IEICE (The Institute of Electronics, Information and Communication Engineers)—Fall Conference, Sep. 5, 1994, Foundation and Boundary, p. 230.

* cited by examiner

Primary Examiner—Barbara Summons
(74) Attorney, Agent, or Firm—Darby & Darby (57) ABSTRACT In the surface acoustic wave filter, a longitudinally-coupled double-mode resonator filter formed by arranging a plurality of inter-digital transducers for exciting and receiving a surface acoustic wave adjacent each other in the direction of propagation of the surface acoustic wave is connected in series to a resonator having one or a plurality of inter-digital transducers for exciting and receiving a surface acoustic wave. A cutoff frequency on the high-frequency side of the pass band of the longitudinally-coupled double-mode resonator filter and the antiresonant frequency of the resonator are substantially equal. In the surface acoustic wave filter, the sharpness in the vicinity of the cutoff frequency on the high-frequency side of the pass band is high, sufficient attenuation can be obtained, and the input and output impedance matching state is good.

12 Claims, 10 Drawing Sheets

SURFACE ACOUSTIC WAVE FILTER

BACKGROUND OF THE INVENTION

1. Field of the Invention

The present invention relates to a surface acoustic wave filter (SAW filter) for use as a high-frequency device in mobile communication apparatuses.

2. Description of Related Art

A surface acoustic wave (SAW) is a wave propagated as a result of concentration of energy near a surface of an elastic body such as a piezoelectric substrate. Electronic devices using the surface acoustic wave, such as filters, resonators, delay lines and oscillators, have been put to practical applications.

Figure 1:
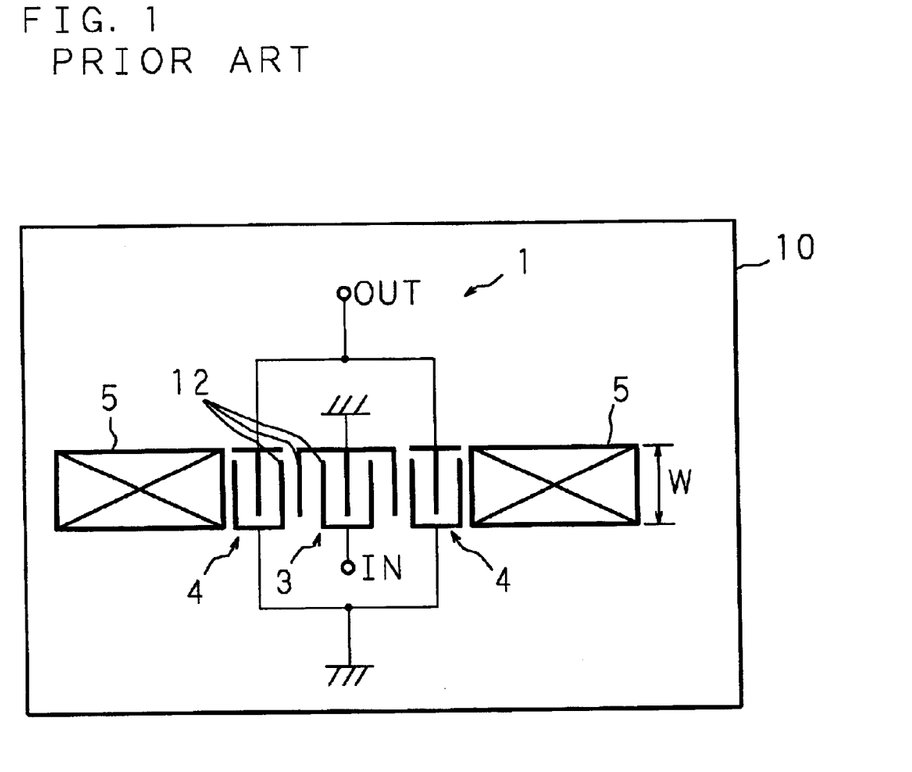
FIG. 1 is a schematic view showing an example of the structure of a longitudinally-coupled double-mode resonator filter.

FIG. 1 is a schematic view showing an example of the structure of a longitudinally-coupled double-mode resonator filter as one of SAW filters. In the longitudinally-coupled double-mode resonator filter 1, three inter-digital transducers 4, 3, 4 (IDTs) for exciting and receiving a surface acoustic wave are arranged in the direction of propagation of the surface acoustic wave on a piezoelectric substrate 10. Two reflectors 5 for reflecting the surface acoustic wave are provided on both sides of the three inter-digital transducers 4, 3, 4, in the direction of propagation of the surface acoustic wave.

In each of the inter-digital transducers 3 and 4, two IDT electrodes having a number of (omitted in FIG. 1) electrode fingers 12 are disposed to face each other so that their electrode fingers 12 cross at equal intervals. Among the three inter-digital transducers 4, 3, 4, the IDT electrode on one side of the center inter-digital transducer 3 has an input terminal IN of the longitudinally-coupled double-mode resonator filter 1. The IDT electrode on the other side of the center inter-digital transducer 3 is connected to the ground. The IDT electrode on one side of each of the inter-digital transducers 4 on both sides is connected to the ground. The IDT electrodes on the other side of the inter-digital transducers 4 on both sides are connected together and has an output terminal OUT of the longitudinally-coupled double-mode resonator filter 1.

In each reflector 5, a number of (omitted in FIG. 1) electrode fingers similar to the electrode fingers 12 of the inter-digital transducers 3 and 4 are arranged at substantially the same intervals as the intervals in the inter-digital transducers 3 and 4. The three inter-digital transducers 4, 3, 4 and the reflectors 5 have substantially an equal aperture length W that is a length in a direction orthogonal to the direction of propagation of the surface acoustic wave.

Figure 2A:
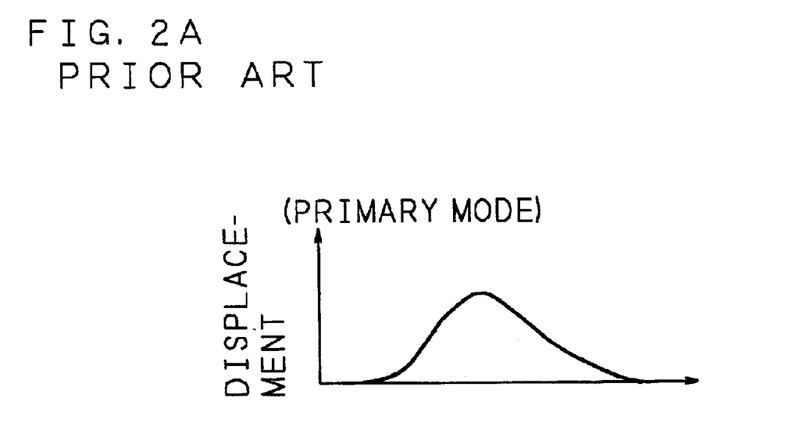
FIGS. 2A and 2B are explanatory views of a mode showing the standing wave displacement distribution.
Figure 2B:
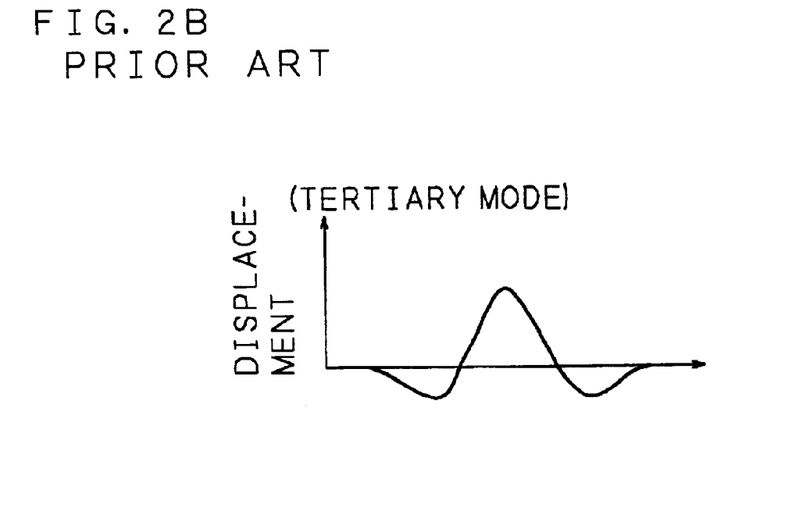

In the longitudinally-coupled double-mode resonator filter 1 having such a structure, when an alternating voltage is applied to the input terminal IN, the piezoelectric substrate 10 has a distortion between adjacent electrode fingers 12 as a result of the piezoelectric effect, and the surface acoustic wave is excited. The surface acoustic wave is most strongly excited when its wavelength and the pitch of the electrode fingers 12 are equal to each other. Since the excited surface acoustic wave is reflected by the two reflectors 5, the vibration energy is enclosed between the two reflectors 5, and a standing wave is generated to resonate. This resonated output can be obtained from the output terminal OUT. The standing wave has a dual mode in which a primary-mode wave having a displacement distribution as shown in FIG. 2A and a tertiary-mode wave having a displacement distribution as indicated in FIG. 2B exist.

Figure 3A:
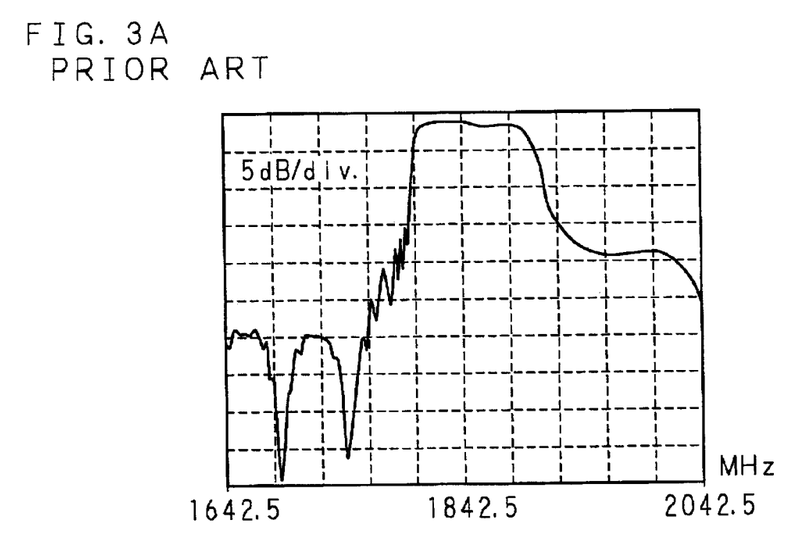
FIGS. 3A and 3B are views showing the characteristics of the longitudinally-coupled double-mode resonator filter.

In the longitudinally-coupled double-mode resonator filter 1 as described above, various filter characteristics are obtained by setting the design parameters. However, regarding the pass band characteristic, in general, the sharpness in the vicinity of a cutoff frequency on the high-frequency side is unsatisfactory as shown in FIG. 3A. Therefore, there is a problem that sufficient attenuation cannot be obtained.

Figure 3B:
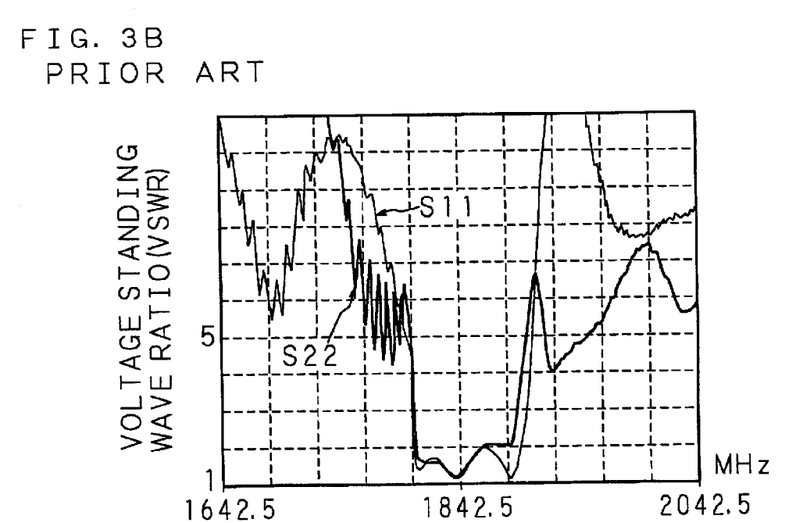

Moreover, a difference in the electrode structure between the input side and the output side causes a problem of poor input and output impedance matching. In FIG. 3B, the reflection characteristics are shown by representing each of the relationship S11 between the incident wave from the input side (IN) and the wave reflected in the filter to return to the input side and the relationship S22 between the incident wave from the output side (OUT) and the wave reflected in the filter to return to the output side by a voltage standing wave ratio (VSWR). The voltage standing wave ratio (VSWR) is the ratio of the maximum voltage and the minimum voltage when the magnitude of the standing wave generated on the propagation path is shown in voltage. As the value becomes closer to 1, the matching state is improved. As shown in FIG. 3B, the characteristic S11 shows a value substantially 2 or less within the pass band and is thus satisfactory, but the characteristic S22 is inferior to the characteristic S11.

Figure 4:
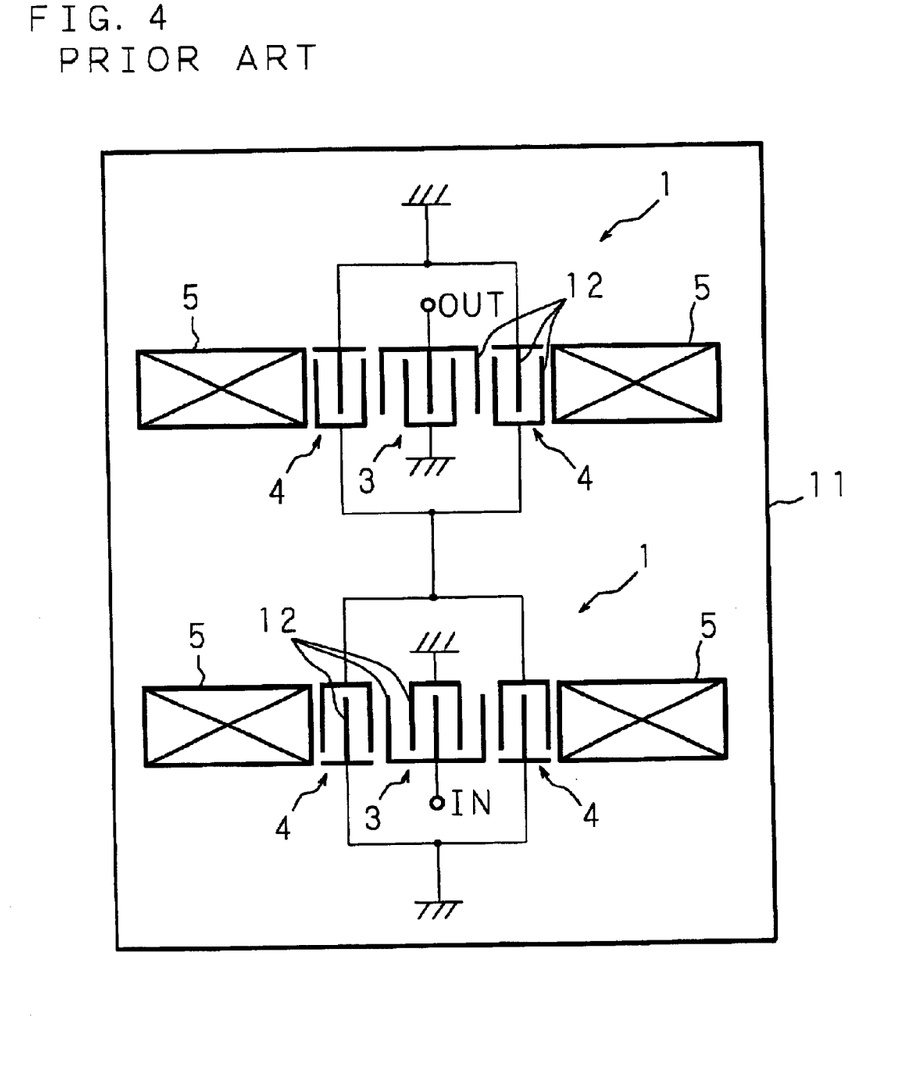
FIG. 4 is a schematic view showing an example of the structure where longitudinally-coupled double-mode resonator filters are vertically connected in two stages.

In order to solve the above problem, with a prior art, as shown in FIG. 4, the longitudinally-coupled double-mode resonator filters 1 as described above are vertically connected in two stages on a piezoelectric substrate 11. As a result, the vicinity of the cutoff frequency on the high-frequency side was suppressed. However, this structure was suffered from a large insertion loss (difference between the attenuation when the filter was inserted and the attenuation when the filter was not inserted).

As one example of a technique using a longitudinally-coupled double-mode resonator filter with respect to similar problems, Japanese Laid-Open Patent Publication No. 8-191229 (1996) discloses a "longitudinally-coupled double-mode resonator SAW filter". In the "longitudinally-coupled double-mode resonator SAW filter", the inter-center intervals of the facing innermost electrode fingers of a center IDT and of each of side IDTs are different on the right and left sides.

BRIEF SUMMARY OF THE INVENTION

The present invention has been made with the aim of solving the above problems, and an object of the present invention is to provide a surface acoustic wave filter having high sharpness in the vicinity of the cutoff frequency on the high-frequency side of the pass band and capable of obtaining sufficient attenuation and a good input and output matching state.

A surface acoustic wave filter according to the present invention comprises a longitudinally-coupled double-mode resonator filter in which a plurality of inter-digital transducers for exciting and receiving a surface acoustic wave are arranged adjacent to each other in the direction of propagation of the surface acoustic wave, and a resonator having one or a plurality of inter-digital transducers for exciting and receiving a surface acoustic wave. The longitudinally-coupled double-mode resonator filter and the resonator are connected in series. The cutoff frequency on the high-frequency side of the pass band of the longitudinally-coupled double-mode resonator filter and the antiresonant frequency of the resonator are substantially equal.

Two reflectors for reflecting the surface acoustic wave are provided on both sides of the plurality of inter-digital transducers arranged in the longitudinally-coupled double-mode resonator filter, in the propagation direction. Vibration energy of the surface acoustic wave can be enclosed between the two reflectors.

The resonator is a one-port resonator. Two reflectors for reflecting the surface acoustic wave are provided on both sides of the resonator, in the direction of propagation of the surface acoustic wave.

In the surface acoustic wave filter according to the present invention, the longitudinally-coupled double-mode resonator filter and the resonator are mounted on a single piezoelectric substrate. It is therefore possible to realize a surface acoustic wave filter having smaller dimensions.

Figure 5:
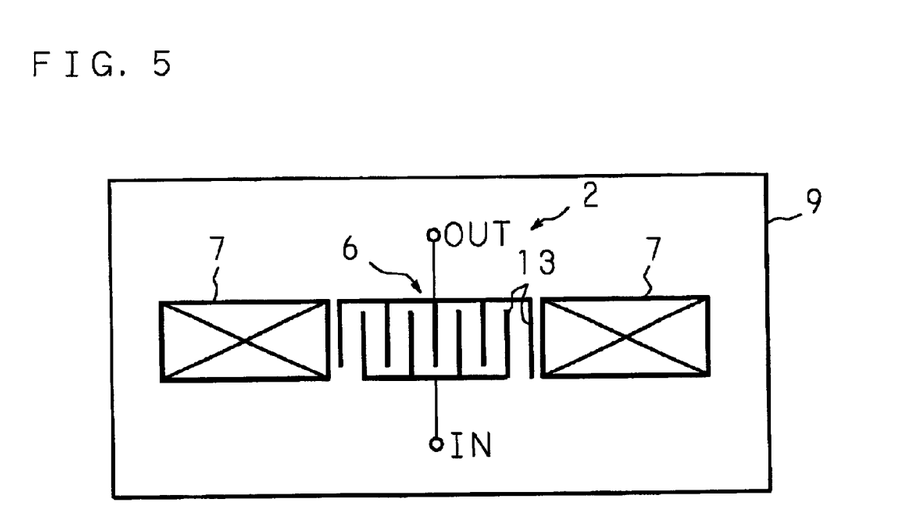
FIG. 5 is a schematic view showing an example of the structure of a one-port resonator.

FIG. 5 is a schematic view showing an example of the structure of a one-port resonator as a resonator using a surface acoustic wave. In this one-port resonator, two reflectors 7 for reflecting a surface acoustic wave are mounted on a piezoelectric substrate 9 on both sides of an inter-digital transducer 6 (IDT) for exciting and receiving the surface acoustic wave, in the direction of propagation of the surface acoustic wave.

In the inter-digital transducer 6, two IDT electrodes having a number of (omitted in FIG. 5) electrode fingers 13 are disposed to face each other so that their electrode fingers 13 cross at equal intervals. The IDT electrode on one side of the inter-digital transducer 6 has an input terminal IN of the one-port resonator 2, while the IDT electrode on the other side has an output terminal OUT.

In each reflector 7, a number of (omitted in FIG. 5) electrode fingers similar to the electrode fingers 13 of the inter-digital transducer 6 are arranged at substantially the same intervals as the intervals in the inter-digital transducer 6.

In the one-port resonator 2 having such a structure, when an alternating voltage is applied across the input terminal IN and output terminal OUT, the piezoelectric substrate 9 has a distortion between adjacent electrode fingers 13 as a result of the piezoelectric effect, and the surface acoustic wave is excited. The surface acoustic wave is most strongly excited when its wavelength and the pitch of the electrode fingers 13 are equal to each other. Since the excited surface acoustic wave is reflected by the two reflectors 7, the vibration energy is enclosed between the two reflectors 7, and a standing wave is generated to resonate.

Figure 6:
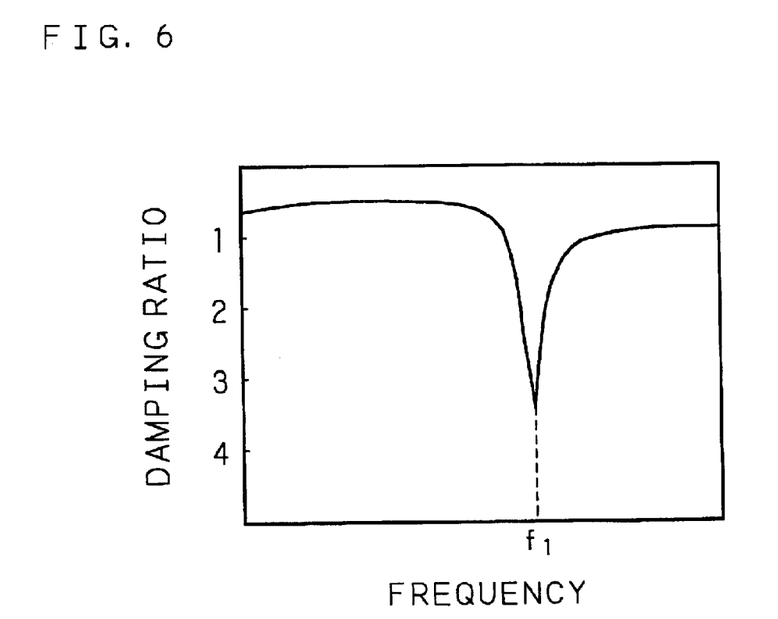
FIG. 6 is a view showing the frequency characteristics of the one-port resonator.

The one-port resonator 2 has the frequency characteristics as shown in FIG. 6, for example, and has an antiresonant frequency f1. In the present invention, the longitudinally-coupled double-mode resonator filter 1 and the one-port resonator 2 are connected in series, and the cutoff frequency on the high-frequency side of the pass band of the longitudinally-coupled double-mode resonator filter 1 and the antiresonant frequency f1 of the one-port resonator 2 are substantially equal. As a result, the pass band characteristics show higher sharpness in the vicinity of the cutoff frequency on the high-frequency side, and sufficient attenuation is obtained.

In the surface acoustic wave filter according to the present invention, a pitch of electrode fingers in the inter-digital transducers of the resonator is larger than a pitch of electrode fingers in the inter-digital transducers of the longitudinally-coupled double-mode resonator filter. Since antiresonant frequency of the inter-digital transducers of the resonator is adjusted by adjusting the wavelength thereof, the antiresonant frequency of the inter-digital transducers of the resonator is adjusted to a frequency on the high-frequency side of the cutoff frequency of the longitudinally-coupled double-mode resonator filter in the present invention.

Additionally, in the surface acoustic wave filter according to the present invention, the longitudinally-coupled double-mode resonator filter is provided with three inter-digital transducers, since more than two inter-digital transducers are indispensable in order to obtain pass band higher than 75 MHz (with the fractional bandwidth of 4.1 to 4.3%). Since the longitudinally-coupled double-mode resonator filter includes only three inter-digital transducers, which meet the minimal requirements, the number of the design parameters to set for the filter can be reduced.

The above and further objects and features of the invention will more fully be apparent from the following detailed description with accompanying drawings.

DETAILED DESCRIPTION OF THE INVENTION

The following description will explain the present invention with reference to the drawings illustrating an embodiment thereof.

Figure 7:
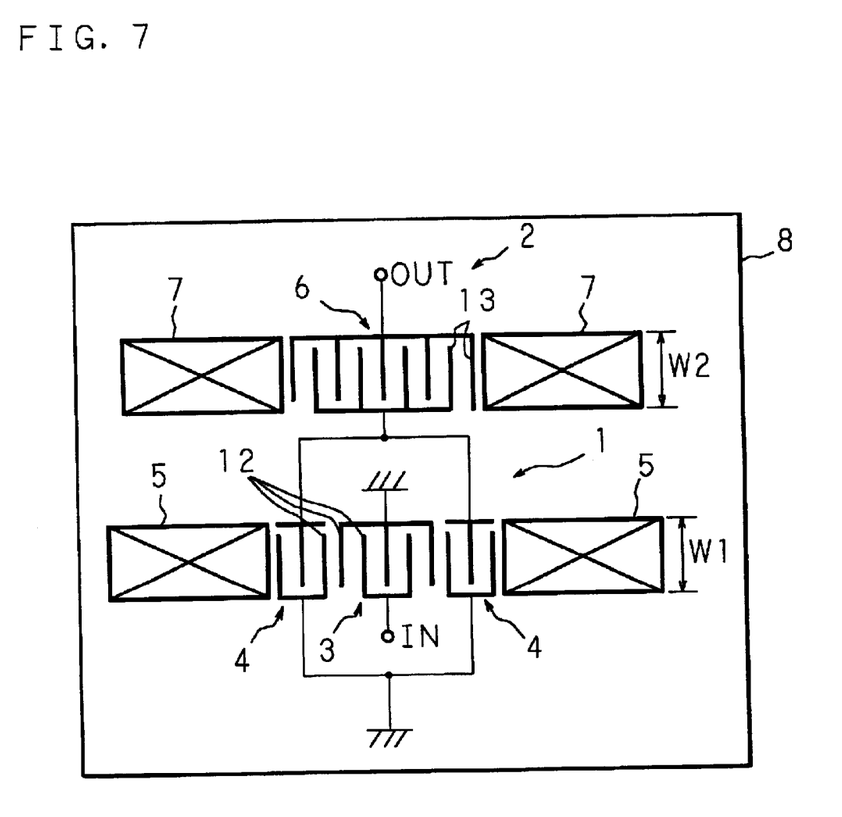
FIG. 7 is a schematic view showing the structures of essential sections of an embodiment of a surface acoustic wave filter (SAW filter) according to the present invention.

FIG. 7 is a schematic view showing the structures of essential sections of the embodiment of a surface acoustic wave filter (SAW filter) according to the present invention. This SAW filter is constructed by connecting a longitudinally-coupled double-mode resonator filter 1 and a one-port resonator 2 in series on a piezoelectric substrate 8.

In the longitudinally-coupled double-mode resonator filter 1, three inter-digital transducers 4, 3, 4 (IDTs) for exciting and receiving a surface acoustic wave are arranged in the direction of propagation of the surface acoustic wave. Two reflectors 5 for reflecting the surface acoustic wave are provided on both sides of the three inter-digital transducers 4, 3, 4, in the direction of propagation of the surface acoustic wave.

In each of the inter-digital transducers 3 and 4, two IDT electrodes having a number of (omitted in FIG. 7) electrode fingers 12 are disposed to face each other so that their electrode fingers 12 cross at equal intervals. By adjusting the distance (a so-called connected length) between adjacent electrode fingers 12 of the inter-digital transducers 3 and 4, the filter characteristics are adjusted.

In each reflector 5, a number of (omitted in FIG. 7) electrode fingers similar to the electrode fingers 12 of the inter-digital transducers 3 and 4 are arranged at substantially the same intervals as the intervals in the inter-digital transducers 3 and 4. The three inter-digital transducers 4, 3, 4 and the reflectors 5 have substantially an equal aperture length W1 that is a length in a direction orthogonal to the direction of propagation of the surface acoustic wave. However, their aperture lengths W1 are not necessarily equal.

In the one-port resonator 2, two reflectors 7 for reflecting a surface acoustic wave are provided on both sides of the inter-digital transducer 6 for exciting and reflecting the surface acoustic wave, in the direction of propagation of the surface acoustic wave.

In the inter-digital transducer 6, two IDT electrodes having a number of (omitted in FIG. 7) electrode fingers 13 are disposed to face each other so that their electrode fingers 13 cross at equal intervals.

In each reflector 7, a number of (omitted in FIG. 7) electrode fingers similar to the electrode fingers 13 of the inter-digital transducer 6 are arranged at substantially the same intervals as the intervals in the inter-digital transducer 6. The inter-digital transducer 6 and the reflectors 7 have substantially an equal aperture length W2 that is a length in a direction orthogonal to the direction of propagation of the surface acoustic wave. However, their aperture lengths W2 are not necessarily equal.

Among the three inter-digital transducers 4, 3, 4 of the longitudinally-coupled double-mode resonator filter 1, the IDT electrode on one side of the center inter-digital transducer 3 has an input terminal IN of this SAW filter. The IDT electrode on the other side of the center inter-digital transducer 3 is connected to the ground. The IDT electrode on one side of each of the inter-digital transducers 4 on both sides is connected to the ground, while the IDT electrodes on the other side of the inter-digital transducers 4 on both sides are connected together and then connected to a terminal of the one-port resonator 2.

The IDT electrodes on the other side of the inter-digital transducers 4 of the longitudinally-coupled double-mode resonator filter 1 have a common connection with the IDT electrode on one side of the inter-digital transducer 6 of the one-port resonator 2. The IDT electrode on the other side of the inter-digital transducer 6 has the output terminal OUT of this SAW filter.

In the SAW filter having such a structure, when an alternating voltage is applied to the input terminal IN, the piezoelectric substrate 8 has a distortion between adjacent electrode fingers 12 as a result of the piezoelectric effect of the longitudinally-coupled double-mode resonator filter 1, and the surface acoustic wave is excited. The surface acoustic wave is most strongly excited when its wavelength and the pitch of the electrode fingers 12 are equal to each other. Since the excited surface acoustic wave is reflected by the two reflectors 5, the vibration energy is enclosed between the two reflectors 5, and a standing wave is generated to resonate. This resonated output is supplied to the one-port resonator 2.

In the one-port resonator 2, upon the supply of the output of the longitudinally-coupled double-mode resonator filter 1, the piezoelectric substrate 8 has a distortion between adjacent electrode fingers 13 as a result of the piezoelectric effect, and the surface acoustic wave is excited. The surface acoustic wave is most strongly excited when its wavelength and the pitch of the electrode fingers 13 are equal to each other. Since the excited surface acoustic wave is reflected by the two reflectors 7, the vibration energy is enclosed between the two reflectors 7, and a standing wave is generated to resonate. This resonated output is outputted from the output terminal OUT of the SAW filter.

The one-port resonator 2 has the frequency characteristics as shown in FIG. 6, and has an antiresonant frequency f1. This antiresonant frequency f1 and the cutoff frequency on the high-frequency side of the pass band of the longitudinally-coupled double-mode resonator filter 1 are substantially equal. As a result, the overall pass band characteristic of the SAW filter achieves high sharpness in the vicinity of the cutoff frequency on the high-frequency side, thereby obtaining sufficient attenuation.

For the piezoelectric substrate 8, it is possible to use 42°Y (cut)-X (propagation) $LiTaO_3$, 36°Y-X $LiTaO_3$, 64°Y-X $LiNbO_3$, 41°Y-X $LiNbO_3$ or 128°Y-X $LiNbO_3$, and it is also possible to use X-cut $LiTaO_3$ or X-cut $LiNbO_3$. Moreover, other piezoelectric body such as quartz and langasite may also be used for the piezoelectric substrate 8. Furthermore, it is also possible to use not only a single crystal body, but also a thin-film piezoelectric body such as AlN (aluminum nitride), ZnO, $PbTiO_3$, and $BaTiO_3$.

The material for the inter-digital transducer (IDT) and the reflector is Al or Al-Cu (1%). The coating thickness of the inter-digital transducer is, in order to obtain 1.7 to 2.0 GHz as the pass band for example, 80 to 220 nm, preferably 140 to 180 nm in view of the band-pass characteristics (the band-pass width and the sharpness in the vicinity of the cutoff frequency). Moreover, the connected length is an effective length.

Although the reflectors 5 are included in the structure of the longitudinally-coupled double-mode resonator filter 1 in the above explanation, the reflectors 5 are not essential. A structure having no reflectors 5 can be realized depending on the number of the inter-digital transducers 3 and 4 and the positioning method, the use of reflection on the crystal end face, and the like. Furthermore, in the one-port resonator 2, it is possible to use an inter-digital transducer 6 having no reflectors 7.

Besides, in the case where the direction of propagation of the surface acoustic wave of the longitudinally-coupled double-mode resonator filter and the direction of propagation of the surface acoustic wave of the resonator are made different, for example, the inter-digital transducers are sometimes positioned to cross each other at right angles.

In addition, while the structure using the one-port resonator 2 is explained here, the resonator is not necessarily limited to one port. A structure using a two-port resonator may be used.

The process of designing the above-described SAW filter is as follows. First, the parameters of one stage of the longitudinally-coupled double-mode resonator filter 1 are designed so as to achieve a high suppression on the low-frequency side of the pass band and have high sharpness on the low-frequency side.

Next, the suppression and sharpness on the high-frequency side of the pass band are designed so that the antiresonant frequency of the one-port resonator 2 and the cutoff frequency on the high-frequency side of the pass band are substantially equal. For this purpose, in the one-port resonator 2, the wavelength (twice the pitch of the electrode fingers), the aperture length and the number of the electrode fingers are adjusted. More specifically, in the one-port resonator 2, the aperture length that affects the filter waveform and the number of electrode fingers 13 and the number of electrode fingers of the reflectors 7 are adjusted so as to adjust the filter waveform of the pass band.

Next, as the optimum adjusting method, the parameters of the one-port resonator are adjusted so that the above-mentioned characteristics S11 and S22 are similar in the vicinity of the pass band. After setting the parameters of the one-port resonator 2, the parameters of the longitudinally-coupled double-mode resonator filter 1 are further adjusted so as to adjust the pass band width and the voltage standing wave ratio (VSWR) in the pass band.

Experiment 1

An experiment on the above-described SAW filter was carried out by setting the design parameters as follows.

As for the longitudinally-coupled double-mode resonator filter 1, the number of the electrode fingers of the inter-digital transducer 3 was 27, the number of the electrode fingers of the inter-digital transducer 4 was 19, the wavelength (twice the pitch of the electrode fingers) of the inter-digital transducers 3 and 4 was 2.13 μm, the metallization ratio of the electrode fingers of the inter-digital transducers 3 and 4 was 65, the wavelength (twice the pitch of the electrode fingers) of the reflector 5 was 2.19 μm, the metallization ratio of the reflector 5 was 65, and the aperture length was 170 μm.

As for the one-port resonator 2, the number of the electrode fingers of the inter-digital transducer 6 was 251, the wavelength (twice the pitch of the electrode fingers) of the inter-digital transducer 6 was 2.14 μm, the metallization ratio of the inter-digital transducer 6 was 50, the wavelength (twice the pitch of the electrode fingers) of the reflector 7 was 2.14 μm, the metallization ratio of the reflector 7 was 50, and the aperture length was 50 μm.

Figure 8A:
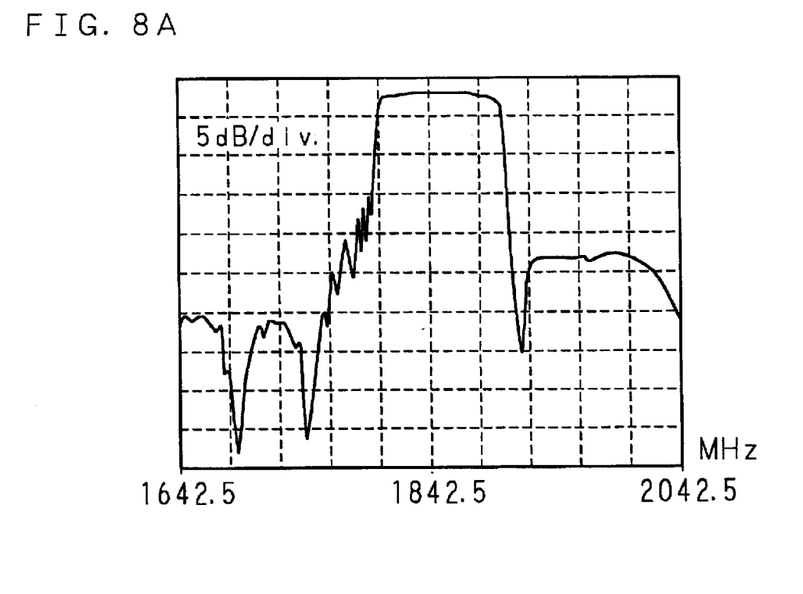
FIGS. 8A and 8B are views showing the characteristics of a surface acoustic wave filter (SAW filter) of the present invention according to Experiment 1.
Figure 8B:
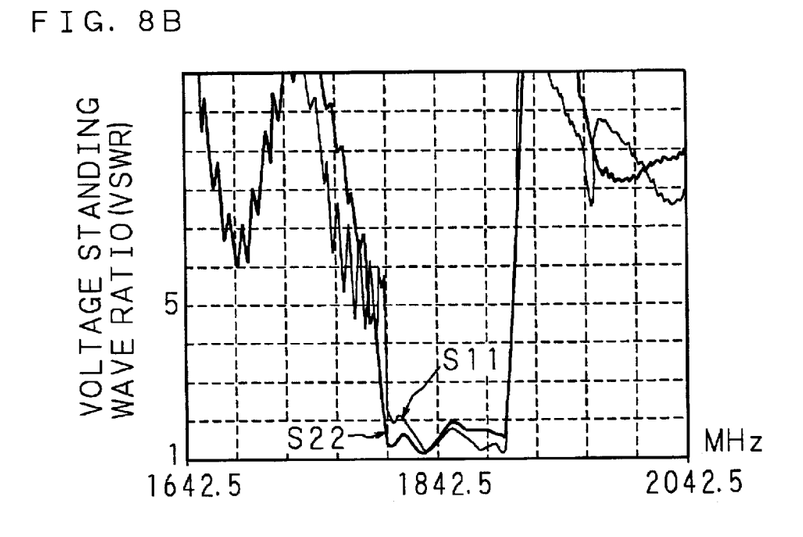

FIG. 8A shows the pass band characteristics of the surface acoustic wave filter according to Experiment 1. In FIG. 8B, the reflection characteristics are shown by representing each of the relationship S11 between the incident wave from the input side (IN) and the wave reflected in the filter to return to the input side and the relationship S22 between the incident wave from the output side (OUT) and the wave reflected in the filter to return to the output side by a voltage standing wave ratio (VSWR). Both the characteristics S11 and S22 showed the values substantially 2 or less within the pass band, and matched.

With the above parameters, the pass band was 1805 to 1880 MHz. In order to obtain 1710 to 1785 MHz as the pass band, the wavelength is mainly adjusted, but other parameters are substantially the same.

Figure 9A:
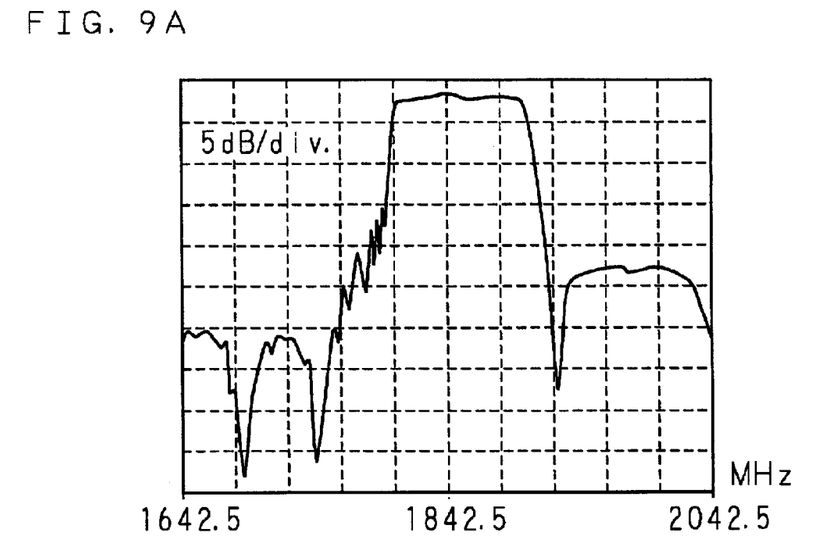
FIGS. 9A and 9B are views showing the characteristics of a surface acoustic wave filter (SAW filter) which was not well adjusted.
Figure 9B:
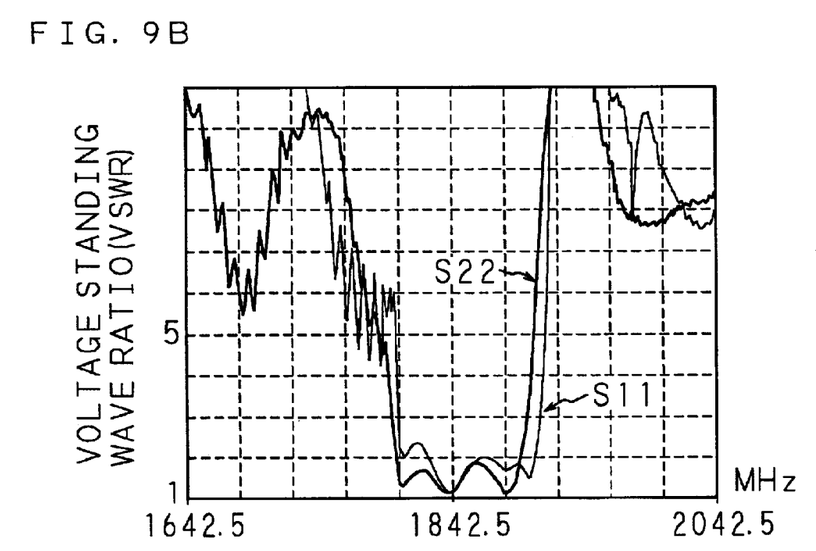

Furthermore, FIG. 9A shows the pass band characteristics when the antiresonant frequency of the one-port resonator 2 was shifted to a higher frequency side in the structure (FIG. 7) similar to that of the above-described SAW filter. Since the VSWR characteristics of the characteristics S11 and S22 did not match as shown in FIG. 9B, both the sharpness (FIG. 9A) and the VSWR characteristics (FIG. 9B) were inferior to those of FIGS. 8A and 8B.

Experiment 2

An experiment on the above-described SAW filter was carried out by setting the design parameters as follows.

As for the longitudinally-coupled double-mode resonator filter 1, the number of the electrode fingers of the inter-digital transducer 3 was 37, the number of the electrode fingers of the inter-digital transducer 4 was 25, the wavelength (twice the pitch of the electrode fingers) of the inter-digital transducers 3 and 4 was 2.035 μm, the metallization ratio of the electrode fingers of the inter-digital transducers 3 and 4 was 60, the wavelength (twice the pitch of the electrode fingers) of the reflector 5 was 2.081 μm, the metallization ratio of the reflector 5 was 60, and the aperture length was 90 μm.

As for the one-port resonator 2, the number of the electrode fingers of the inter-digital transducer 6 was 251, the wavelength (twice the pitch of the electrode fingers) of the inter-digital transducer 6 was 2.050 μm, the metallization ratio of the inter-digital transducer 6 was 50, the wavelength (twice the pitch of the electrode fingers) of the reflector 7 was 2.050 μm, the metallization ratio of the reflector 7 was 50, and the aperture length was 50 μm.

Figure 10A:
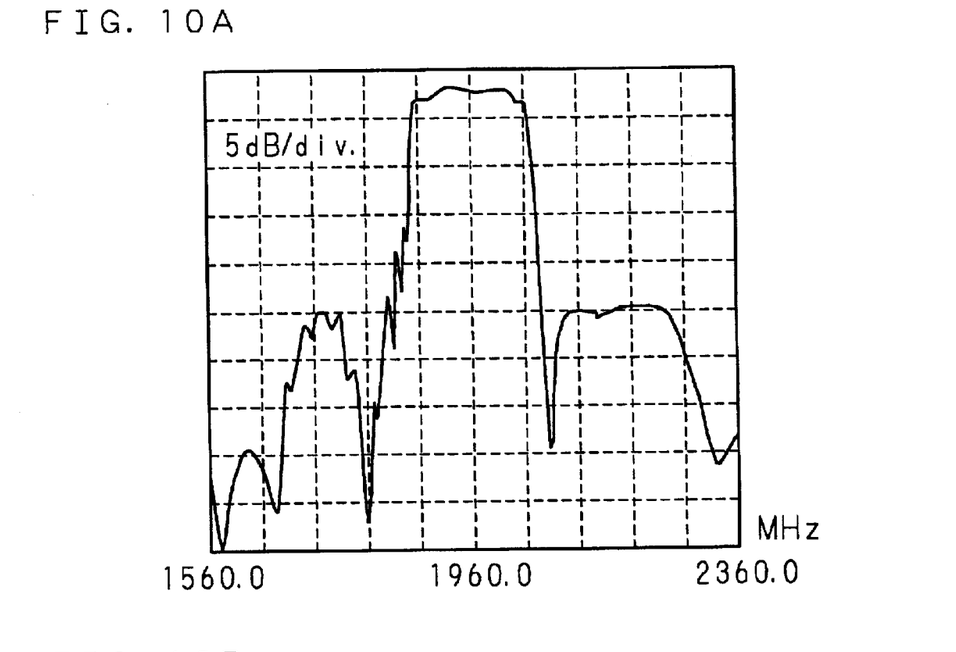
FIGS. 10A and 10B are views showing the characteristics of a surface acoustic wave filter (SAW filter) of the present invention according to Experiment 2.
Figure 10B:
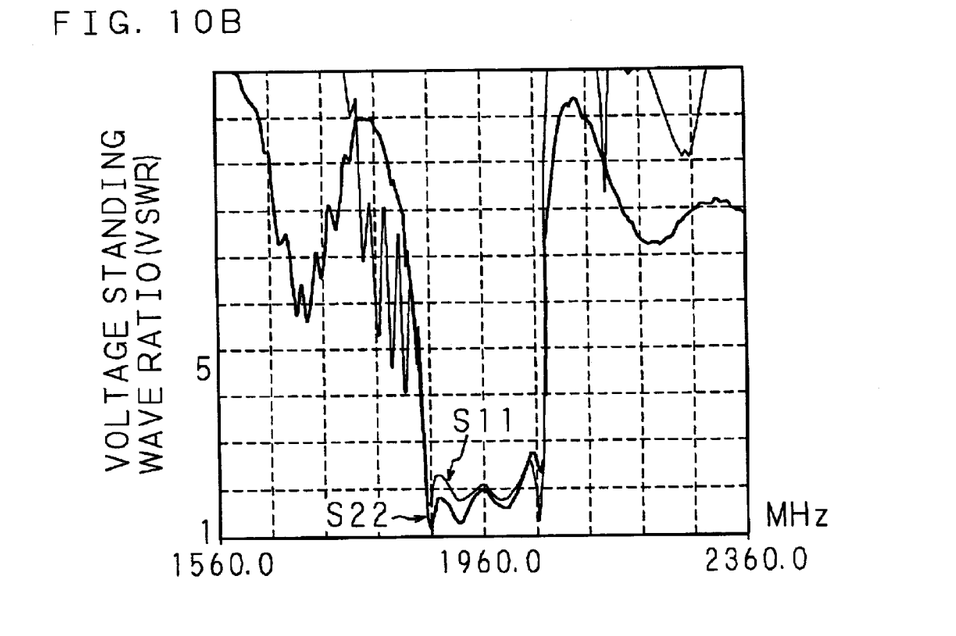

FIG. 10A shows the pass band characteristics of the surface acoustic wave filter according to Experiment 2. In FIG. 10B, the reflection characteristics are shown by representing each of the relationship S11 between the incident wave from the input side (IN) and the wave reflected in the filter to return to the input side and the relationship S22 between the incident wave from the output side (OUT) and the wave reflected in the filter to return to the output side by a voltage standing wave ratio (VSWR). As shown in the figures, the SAW filter according to the present invention is applicable in a frequency band between 1.8 and 1.9 GHz.

Experiment 1 shows the present invention in respect of the frequency band of 1700 to 1800 MHz, while Experiment 2 illustrates the present invention in respect of the frequency band of 1.9 to 2.0 GHz. However, the present invention is also applicable in the RF and IF frequency bands of mobile communications, particularly, the 300 to 500 MHz band, 800 to 900 MHz band, 1500 MHz band, 1.9 to 2.1 GHz band and 2.4 to 2.5 GHz band.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A surface acoustic wave filter comprising:
   a longitudinally-coupled double-mode resonator filter in which a plurality of inter-digital transducers for exciting and receiving a surface acoustic wave are arranged adjacent to each other in a direction of propagation of the surface acoustic wave; and
   a resonator having one or a plurality of inter-digital transducers for exciting and receiving a surface acoustic wave, the resonator being connected to said longitudinally-coupled double-mode resonator filter in series,
   wherein a cutoff frequency on a high-frequency side of a pass band of said longitudinally-coupled double-mode resonator filter and an antiresonant frequency of said resonator are substantially equal.

2. The surface acoustic wave filter according to claim 1, wherein two reflectors for reflecting the surface acoustic wave are provided on both sides of the plurality of inter-digital transducers arranged in said longitudinally-coupled double-mode resonator filter, in the propagation direction, so as to enclose vibration energy of the surface acoustic wave between said two reflectors.

3. The surface acoustic wave filter according to claim 1, wherein said resonator is a one-port resonator.

4. The surface acoustic wave filter according to claim 1, wherein two reflectors for reflecting the surface acoustic wave are provided on both sides of said resonator, in the direction of propagation of the surface acoustic wave.

5. The surface acoustic wave filter according to claim 1, wherein said longitudinally-coupled double-mode resonator filter and said resonator are mounted on a single piezoelectric substrate.

6. The surface acoustic wave filter according to claim 1, wherein said longitudinally-coupled double-mode resonator filter is provided with three inter-digital transducers.

7. A surface acoustic wave filter comprising:
- a longitudinally-coupled double-mode resonator filter in which a plurality of inter-digital transducers for exciting and receiving a surface acoustic wave are arranged adjacent to each other in a direction of propagation of the surface acoustic wave; and
- a resonator having one or a plurality of inter-digital transducers for exciting and receiving a surface acoustic wave, the resonator being connected to said longitudinally-coupled double-mode resonator filter in series,
- wherein a pitch of electrode fingers in the inter-digital transducers of the resonator is larger than a pitch of electrode fingers in the inter-digital transducers of the longitudinally-coupled double-mode resonator filter.

8. The surface acoustic wave filter according to claim 7, wherein two reflectors for reflecting the surface acoustic wave are provided on both sides of the plurality of inter-digital transducers arranged in said longitudinally-coupled double-mode resonator filter, in the propagation direction, so as to enclose vibration energy of the surface acoustic wave between said two reflectors.

9. The surface acoustic wave filter according to claim 7, wherein said resonator is a one-port resonator.

10. The surface acoustic wave filter according to claim 7, wherein two reflectors for reflecting the surface acoustic wave are provided on both sides of said resonator, in the direction of propagation of the surface acoustic wave.

11. The surface acoustic wave filter according to claim 7, wherein said longitudinally-coupled double-mode resonator filter and said resonator are mounted on a single piezoelectric substrate.

12. The surface acoustic wave filter according to claim 7, wherein said longitudinally-coupled double-mode resonator filter is provided with three inter-digital transducers.

* * * * *